United States Patent [19]

McKannan et al.

[11] Patent Number: 5,080,726
[45] Date of Patent: Jan. 14, 1992

[54] DIRECTIONAL SOLIDIFICATION PROCESSING OF ALLOYS USING AN APPLIED ELECTRIC FIELD

[75] Inventors: Eugene C. McKannan, Huntsville; Deborah D. Schmidt, Madison, both of Ala.; Shaffiq Ahmed, Youngstown, Ohio; Robert W. Bond, Huntsville, Ala.

[73] Assignee: The United States of America as represented by the Administrator of the National Aeornautics and Space Administration, Washington, D.C.

[21] Appl. No.: 531,375

[22] Filed: May 31, 1990

[51] Int. Cl.⁵ .......................... C22F 3/02; C30B 13/16
[52] U.S. Cl. ........................ 148/1; 148/154; 148/404; 148/410
[58] Field of Search .................. 148/1, 3, 154, 404, 148/410; 156/603, 604; 164/48, 491, 122.1, 122.2

[56] References Cited
U.S. PATENT DOCUMENTS
4,853,044  8/1989  Ford et al. ........................ 148/404
4,964,453  10/1990  Schmidt et al. .................. 164/122.1

OTHER PUBLICATIONS
Metals Handbook, 9th Edition, vol. 15, 9/1988, pp. 318-323.
Izv. Vyssh. Uchebn. Zaved. Chem. Metall. (1), 124-128, 8/1988.

Primary Examiner—R. Dean
Assistant Examiner—Margery S. Phipps
Attorney, Agent, or Firm—Robert L. Broad, Jr.; Jerry L. Seemann; Harold W. Adams

[57] ABSTRACT

A method is provided for obtaining an alloy having an ordered microstructure which comprises the steps of heating the central portion of the alloy under uniform temperature so that it enters a liquid phase while the outer portions remain solid, applying a constant electric current through the alloy during the heating step, and solidifying the liquid central portion of the alloy by subjecting it to a temperature-gradient zone so that cooling occurs in a directional manner and at a given rate of speed while maintaining the application of the constant electric current through the alloy. The method is particularly suitable for use with nickel-based superalloys. The method of the present invention produces an alloy having superior characteristics such as reduced segregation. After subsequent precipitation by heat-treatment, the alloys produced by the present invention will have excellent strength and high-temperature resistance.

11 Claims, 2 Drawing Sheets

DIRECTIONAL SOLIDIFICATION PROCESSING OF ALLOYS USING AN APPLIED ELECTRIC FIELD

ORIGIN OF THE INVENTION

The invention described herein was made in the performance of work under a NASA contract and is subject to the provisions of Public Law 96-517 (35 USC 202) in which the contractor has elected not to retain title.

FIELD OF THE INVENTION

The invention relates in general to a method of solidifying a liquid alloy so as to obtain an alloy with a desired microstructure, and more specifically to a method of solidifying an alloy in a scientific manner under an applied electric field.

BACKGROUND OF THE INVENTION

The process of solidification of a liquid alloy is a very complex phenomenon involving a multitude of variables and scientific principles. The objective always is to produce, during the solidification processing, the specific metallurgical structure with definite morphological features that are conducive to or instrumental in developing, upon subsequent treatment, the desired properties.

The solidification process is basically a nucleation and growth process, requiring the considerations of several different parameters at the same time. Such parameters include the chemical free energy change between the solid and the liquid phases and its change with composition and temperature, the surface free energy of the solid-liquid interface, the elastic strain energy, the amount of superheating and undercooling, the latent heat of solidification, the microscopic and macroscopic heat flow and fluid flow considerations, the thermal conductivities of the phases and, above all, the interdependence of these parameters. The literature does not contain data for all cases and hence it is sometimes necessary to estimate the importance of a particular variable.

The growth stage that follows the nucleation stage is more complex. It is at this stage that the physical defects (such as the chemical inhomogeneities, the dislocations, the voids, the "undesirable" crystals, etc.) appear. At present, solidification processing is achieved through a variety of methods and techniques, from the simplest to the exotic In all cases the main objective is to develop a microstructure capable of producing the optimum properties desired. In superalloys, there are generally three types of microstructure: the equiaxed grains, the columnar grains, and the single crystal. It is important to note that experts in this field do not agree about the best structure for a particular property requirement.

The simplest structure to produce is the equiaxed grains which need to be smaller for better properties. It is difficult to control the size by the conventional solidification methods. Also, in some cases the grain boundary needs to be strengthened for better properties.

The columnar grains are developed along a crystallographic axis by directional solidification method. Such columnar-crystal structures reduce the grain boundary area and optimize the properties in anisotropic crystals. However, this form also has several disadvantages. First, the orientation of the grains diverge from the axial array such that the final orientation is quite different from the desired one. Second, the dendrite-spacing, porositites, size and number of precipitates are different at different distances form the chill-zone. Third, all nickel base superalloys contain aluminum and titanium which have an inherent tendency to float to the liquid zone due to their lower density (which is less than that of the alloy), thereby producing not only inhomogeneities and impurity segregation but also equiaxed grains from the broken dendrite-arms due to convection ahead of the solidification front. An attempt to control this so-called "freckle formation" with a critical temperature gradient has produced limited success. A high temperature gradient may cause additional problems in producing segregations and inhomogeneities.

The "single crystal" method produces a specific orientation over the entire crystal. It possesses some definite advantages in some cases. However, it is very expensive as is the directional solidification method.

The single crystal and uni-directional solidification methods produce a "single crystal" nickel based superalloy with low modulus material with the expected improvements in low cycle fatigue characteristics. The "single crystal" in superalloys contain, in general, several phases or at least two phases, the matrix and the intermetallic phases, consisting of the gamma and gamma-prime phases, respectively. In some cases, the "directionally solidified" conventional superalloy contains the two-phase matrix of gamma and gamma-prime together with the interdendritic material of gamma/gamma-prime eutectic, carbides and others. It is almost impossible to control the structural variants to an ideal situation.

Moreover, a truly single crystal should contain the phase(s), distributed over the entire crystal with a desired orientation. Such is not the case in superalloys produced with the present methods. The crystal orientation is generally quite random in the directions normal to the growth direction, producing widely different orientations in the transverse direction.

Above all, the micro and macro porosities are invariably present in the nickel based superalloys, irrespective of the solidification processing method used. Due to the lack of sufficient scientific knowledge, the basic factors involved in microporosity formation are not known. It may be related to the volume of the gamma-gamma prime eutectic or it may be related to the voids formed during the present solidification processing. The simple fact still remains that it needs to be controlled.

Also, in the case of a complex superalloy, there exists a good probability of higher diffusivity of certain elements to produce phases with undesirable characteristics, like lower melting point, lower strength, lower fatigue properties. This fact alone defeats the purpose of most solidification methods and results in a premature failure.

To summarize, the prior solidification methods of superalloys offer little or no control of the following important structural parameters regarding the gamma-prime phase:

1. The size of gamma-prime precipitate, which determines to a large extent the yield strength and creep strength.

2. The number of gamma-prime precipitates per unit area, which is determined by the number of nucleation centers, and which controls the size of the precipitates.

3. Its shape, which determines partly its inherent stability, and which depends on homogeneity as well as other factors.

4. The ordered nature of the gamma-prime, which offers resistance to dislocation motion.

Furthermore, the prior art methods do not suppress the gamma-prime phase and have it precipitate later, which would result in a large number of nucleation centers, allow control of the size and the number of gamma-prime precipitates, and make the average distance between the particles small. These factors, which will provide maximum strengthening of the alloy, are presently impossible to achieve by all current conventional solidification methods known.

It is not possible to control collectively all important parameters by any of the available methods. What is desired, therefore, is the development of a method in which control of all of the important variables in solidification processing is possible, and in which an alloy having an ideal or desired microstructure can be obtained that will have superior qualities in terms of strength and temperature resistance It is further desired that these desirable qualities are produced in a simple, efficient and inexpensive manner.

SUMMARY OF THE INVENTION

In accordance with the present invention, a method is provided for obtaining an alloy having an ordered microstructure which comprises the steps of:

(a) heating a central portion of a solid alloy under uniform temperature so that the central portion enters a liquid phase while the outer portions of the alloy remain in the solid phase;

(b) applying a constant electric current through the alloy during the heating step; and (c) solidifying the liquid central portion of the alloy by subjecting the central portion to a temperature-gradient zone so that cooling occurs in a directional manner and at a given rate of speed, while maintaining the application of a constant electric current through the alloy.

The method of the present invention should produce an alloy having a more homogeneous microstructure, and an ordered arrangement in the gamma phase with reduced segregation. After subsequent precipitation by heat treatment, the alloy produced by the method of the present invention will be superior in terms of strength and high temperature resistance.

DETAILED DESCRIPTION OF THE PREFERRED EMBODIMENTS

Figure 1:
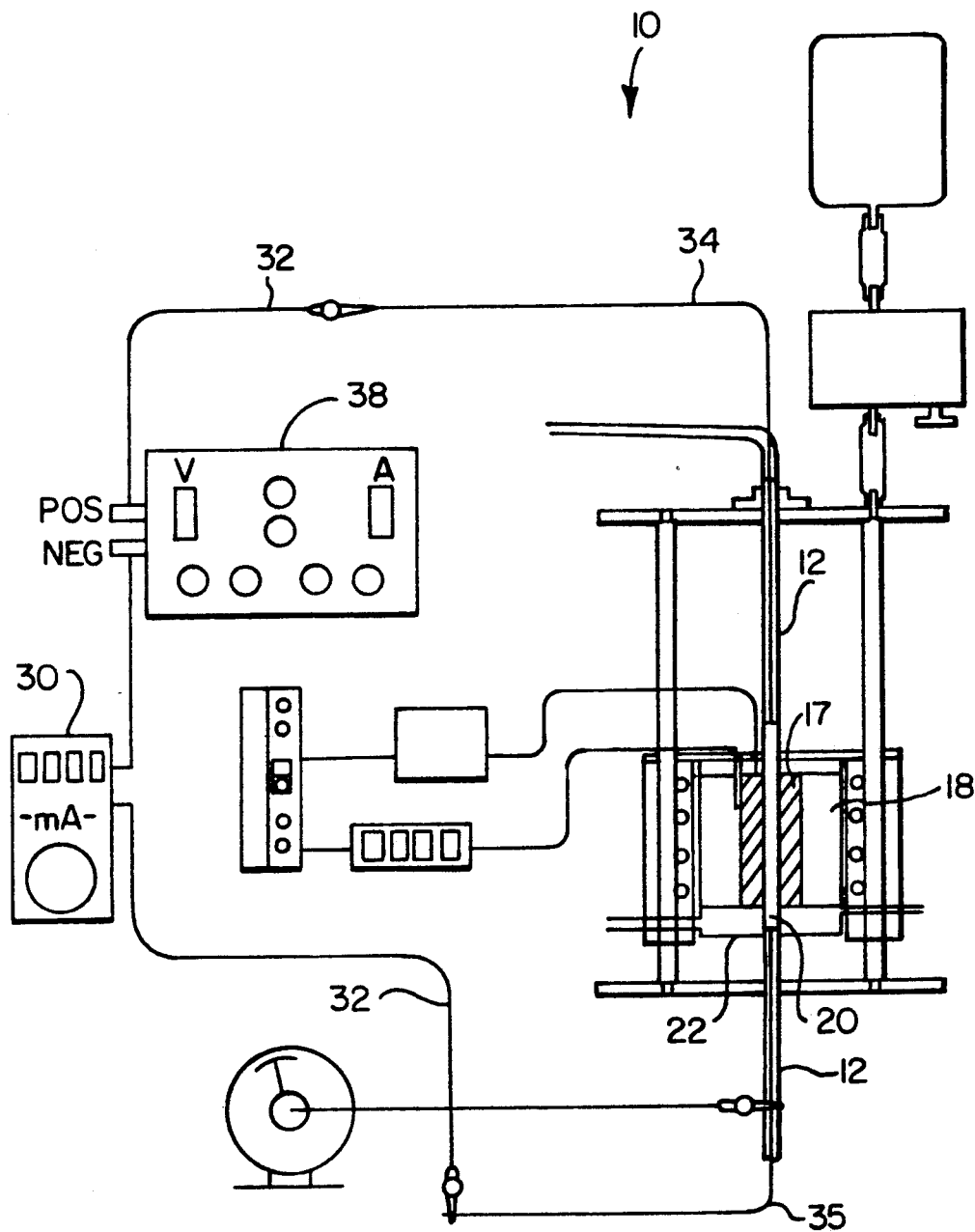
FIG. 1 is a schematic view of an apparatus for carrying out the method of the present invention.

To produce an alloy having desirable characteristics, one must focus on the internal structure of the alloy. All properties of materials, metallic or non-metallic, are directly or indirectly determined, to a large extent, by the internal structure of the material. The internal structure, in the case of alloys, includes considerations of the crystal structure; the bonding mechanisms; the configuration and population of the energy band of the solid together with the density of states and the electron-hole number; the nature of the solid solutions and/or compounds; the stability of the phases under various conditions of temperatures, pressure and environments; their coherency across the interface boundaries; their degree of order; the size, shape and distribution of the phases. All of these factors are known to play important roles in determining the performance of a solid under service conditions.

Each element in the periodic table has its own unique energy level diagram, producing the distinct spectral line under an applied electric field (of appropriate magnitude). This is known as the Stark effect, and results from the shifting of energy states of certain levels. The Stark effect is used in the determination of molecular structure, the nature of the excited states and the electric dipole moments and the changes in dipole moments under the electrical excitation. It is believed that this change results from a modification of electrical charge distribution in the atom.

The simplest model of a metallic solid consists of ions and electrons. The ions are arranged in a periodic manner in the crystal depending on the nature of the electrostatic forces. The "valence" electrons in the energy band of the solid move about the entire crystal following certain rules, but they cannot leave the solid due to the potential energy barrier. It is these electrons that are responsible for the metallic binding, the electrical conductivity, the magnetic properties and even the solubility limit of the primary solid solution. The total chemical free energy of the system consists of the chemical potentials of the ions and the electrons together with the interaction energies. Also, the crystalline arrangement of ions and the nature of the energy band of the solid determine to a large extent all physical, chemical and mechanical properties of the metallic solid. All metallic alloys, particularly the Nickel- and Cobalt-based superalloys, have electromagnetic characteristics.

A metal in the superheated liquid state should be considered a plasma of electrons and ions. Like all plasmas of electrons and ions, here one observes a new effect of Stark broadening of spectral lines under an electric field of approximate strength due to the oscillations of ions and electrons under the applied electric field. The ion's contribution is small and is negligible and, the outstanding contribution is made by the electrons. The broadening effect is proportional to the electron density of the plasma (being dominant in case of an electron density higher than $10^{15}/cm^3$). The plasma oscillates with a definite frequency and amplitude. This oscillatory energy is useful in aligning the particular ions in a direction, determined by the interactions of the electric vectors of the ions, the electrons and the applied electric field. Therefore, it is reasonable to expect an alignment of the electric vectors in a given direction. Such an alignment will introduce an ordered arrangement of the electric vectors, thus introducing an additional degree of order in a somewhat "ordered" alloy. An appropriate rate of cooling during the solidification process together with the proper temperature gradient will ensure the order to be maintained in the alloy.

In an attempt to understand further the basic implications of the invention here, it is necessary to discuss qualitatively several aspects of the solidification process. Solidification is a thermally activated process involving the nucleation of a phase initially and its subsequent growth by diffusion. The nucleation, in the absence of imperfections and inhomogeneities, is expected to be homogeneous. The introduction of the electric field should produce a large number of nucleii in nickel based superalloys. An abundance of nucleii at a certain crystallograph plane, along with the ordered electrical charge distribution, will result in alignment of the ions in a certain direction. The applied field should also inhibit the formation of the gamma-prime phase, possibly through interactions of the electrical vectors.

It is important to note that the mutual stability of gamma and gamma-prime phases in superalloys results from their coherency and order, together with the size, shape and distribution of the precipitated gamma-prime phase. The solidification method under an electric field described in this invention should provide a large number of nucleii of the gamma phase, while suppressing the gamma-prime phase. The solidification method at the same time introduces a higher degree of order. As indicated earlier, such desirable effects cannot be achieved by any present solidification method whatsoever.

According to the present invention, a method is provided wherein solidification of a liquid portion of an alloy is carried out under an applied electric field in an environment or processing system wherein certain solidification variables can be controlled. In carrying out the method of the present invention, it is preferred that the starting material be a solid sample of the alloy. In this case, the samples were machined by an electron discharge machining (EDM) process. Although the present method has been successfully completed using nickel-based superalloys, it is contemplated that this method will be applicable to the solidification of all alloys to produce alloys having a desirable microstructure. The EDM-treated alloy was obtained from a cast ingot, and can be of any desired size or shape, although it is preferred that an elongate cylindrical sample be employed.

Figure 2:
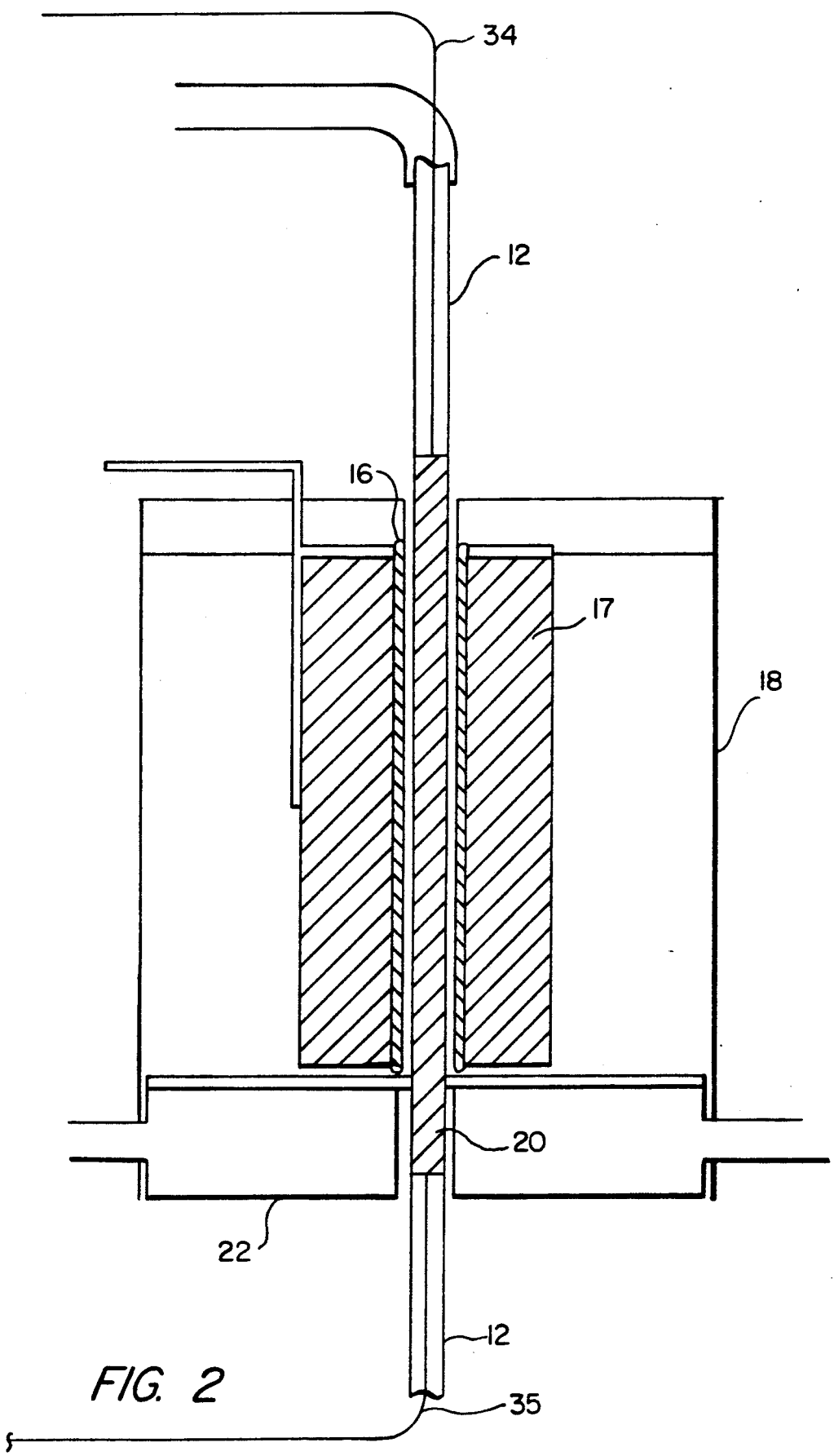
FIG. 2 is a frontal view showing the details of the furnace unit of FIG. 1.

The sample can be processed in any suitable apparatus wherein electrical contacts can be applied to the alloy, and wherein heating can occur over specific region of the alloy while the electric current is passing through it. An example of a suitable apparatus is depicted in FIGS. 1 and 2. The apparatus 10 includes an alumina crucible 12 which holds the alloy sample 20, and which can be placed in an alumina core tube 16 inside core 17 of furnace 18. The furnace 18 must be capable of maintaining a uniform temperature zone of from about 1500° to 1800° C., preferably controlled to within about 20° C. At one end, the furnace is equipped with a means to quench the crucible and sample so as to directionally cool the alloy sample. In the preferred embodiment, this is provided by a copper "chill" or "quench" block 22 through which water can be conveyed.

The chill or quench block 22 is required to produce a zone with a sharp temperature gradient so as to allow translation of the sample in a directional manner. In addition, the cooling by the chill block can be controlled so that translation of the sample can be accomplished at a given rate of speed. The furnace 18 is capable of producing a temperature gradient of about 500° to 900° C. over a distance of about 1 to 2 centimeters. For example, a temperature gradient zone can be achieved wherein the drop in temperature is from 1600° C. to 900° C. over the two cm length nearest the chill block. It is also preferred in this assembly that a flow of inert gas at low pressure is provided over the sample to further protect the sample from incorporating oxidizing impurities.

The apparatus 10 is also preferably provided with means for passing the electric current through the alloy. In the preferred embodiment, an electronically controlled current source 30 is provided for maintaining a constant flow of electricity through the sample 20. In the embodiment shown, copper lead wires 32 direct the current to positive electrode 34 and negative electrode 35 which can be attached to the sample by insertion into holes previously drilled into the sample. Electrodes with a composition of 70% Pt/30% Rh have been employed successfully in the invention. It is also preferred that a voltage stabilizer 38 be employed in the apparatus as well. Ideally, an electric current density of from about 1 milliampere to about 70 amperes per square centimeter is provided by the electrical system.

Using the apparatus as described above, the method of the present invention is carried out using a solid sample of suitable size which has been specially machined by the electron discharge machining process described above. The sample, which has been obtained from a cast ingot, has holes drilled at each end so that the electrical contacts can be inserted into the alloy. The sample 20 is then placed in alumina tube 16 inside core 17 of furnace 18. Once the sample is in place, a flow of an inert gas such as argon is maintained over the alloy, and the sample is heated at a uniform temperature of preferably about 1500° to 1700° C. with the higher range of this temperature (i.e., around 1700+ C.) particularly preferred. During this treatment, the central portion of the alloy enters a liquid phase and the outer portions of the sample away from the furnace core remain solid. This liquid phase is preferably kept in a superheated state for a period of anywhere from 20 minutes to about 5 hours. Throughout this heating state at the uniform temperature, a flow of a constant current of electricity at a specified magnitude is maintained through the alloy. The current density is maintained at about 1 milliampere to about 70 amperes per square centimeter, and will preferably be about ten ma per square centimeter.

At the end of the desired soaking period at uniform temperature, the sample is allowed to translate through the temperature-gradient zone at a desired speed. During the translation process, the flow of constant current sent through the alloy in the earlier heating step is continuously maintained. The entire central portion or "hot" zone of the sample is thus solidified. As indicated above, during this process, only the central portion of the sample has been subjected to the solidification processing, while both ends of the sample remain solid during the entire run.

Metallurgical studies of sample alloys processed in the above manner indicate that the present invention produces alloys with desirable characteristics. Radiographic examinations of the sample alloys have been unable to detect any defects. Metalographic studies of the polished and etched surfaces of properly-processed samples reveal a more homogeneous microstructure.

The solidification process is important since it produces the initial morphological basis for the final structure. The samples obtained using the process as described above are preferably heat treated before their final structure is obtained. The final alloy products produced using the present solidification process of the present invention possess desirable characteristics, such as a more homogeneous microstructure and reduced segregation. The gamma-prime phase produced subsequently through the processing described above should be ordered and coherent with the gamma matrix.

What is claimed is:

1. A method for obtaining an alloy having an ordered microstructure, reduced freckled formation, reduced segregation and controlled microporosity comprising the steps of:
   a. providing a solid alloy and positioning the alloy in a furnace so that a central portion of the alloy can be heated;
   b. heating the central portion of the solid alloy under uniform temperature so that the central portion of the alloy enters a liquid phase while outer portions of the alloy remain in the solid phase;
   c. applying a constant electric current in unidirectional linear manner through the alloy during the heating step; and
   d. solidifying the liquid central portion of the alloy by subjecting the central portion to a temperature-gradient zone so that cooling occurs in a directional manner and at a given rate of speed, while maintaining the application of a constant electric current through the alloy in unidirectional linear manner, thereby forming an alloy having an ordered microstructure, reduced freckle formation, reduced segregation and controlled microporosity.

2. A method according to claim 1, wherein a flow of inert gas in maintained over the alloy during the heating and solidification steps.

3. A method according to claim 1, wherein the alloy treated comprises a nickel-based superalloy.

4. A method according to claim 1, wherein the heating step is conducted at a temperature of from about 1500°–1700° C.

5. A method according to claim 1, wherein the heating step is conducted for a period of from about 20 minutes to about 5 hours.

6. A method according to claim 1, wherein the solidification step occurs at a rate of between about 3 mm and 30 cm per hour.

7. A method according to claim 1, wherein the applied electric current has a current density of from about 1 milliampere to 70 amperes per square centimeter.

8. A method according to claim 1 wherein the solid alloy comprises an elongate sample.

9. A method according to claim 8 wherein the solid alloy comprises an elongate cylindrical sample.

10. A method according to claim 1 wherein the solidification occurs in a unidirectional manner that is substantially parallel to the direction of the applied current.

11. A method according to claim 1 wherein the current is applied to the alloy by means of electrodes attached to the outer portions of the alloy.

* * * * *